United States Patent
Leomant et al.

(10) Patent No.: US 8,004,924 B2
(45) Date of Patent: Aug. 23, 2011

(54) VOLTAGE REGULATOR FOR MEMORY

(75) Inventors: Sylvain Leomant, Carry le Rouet (FR);
Jimmy Fort, Aix en Provence (FR);
Arnaud Turier, Chateauneuf le Rouge (FR); Laurent Vachez, Coudoux (FR);
Lotfi B. Ammar, Gardanne (FR)

(73) Assignee: Atmel Corporation, San Jose, CA (US)

( * ) Notice: Subject to any disclaimer, the term of this patent is extended or adjusted under 35 U.S.C. 154(b) by 365 days.

(21) Appl. No.: 12/388,257

(22) Filed: Feb. 18, 2009

(65) Prior Publication Data

US 2010/0208539 A1 Aug. 19, 2010

(51) Int. Cl.
*G11C 5/14* (2006.01)
(52) U.S. Cl. .......................... 365/229; 365/227; 365/154
(58) Field of Classification Search .................. 365/229, 365/227, 154
See application file for complete search history.

(56) References Cited

U.S. PATENT DOCUMENTS

| | | | | |
|---|---|---|---|---|
| 6,584,030 | B2 * | 6/2003 | Marr | 365/226 |
| 7,020,041 | B2 | 3/2006 | Somasekhar et al. | |
| 7,307,907 | B2 | 12/2007 | Houston | |
| 7,366,036 | B2 | 4/2008 | Cheng et al. | |
| 7,808,856 | B2 * | 10/2010 | Ehrenreich et al. | 365/229 |
| 2005/0243634 | A1 * | 11/2005 | Liaw | 365/227 |
| 2007/0252623 | A1 | 11/2007 | Zampaglione et al. | |
| 2008/0122415 | A1 | 5/2008 | Chou et al. | |
| 2008/0151673 | A1 | 6/2008 | Fallah et al. | |
| 2009/0244956 | A1 * | 10/2009 | Inoue | 365/156 |

OTHER PUBLICATIONS

Khellah, M. M., et al., "A 256-Kb Dual-VCC SRAM Building Block in 65-nm CMOS Process With Actively Clamped Sleep Transistor", *IEEE Journal of Solid-State Circuits*, 42(1), (Jan. 2007), 233-242.

Nii, K, et al., "A 90-nm low-power 32-kB embedded SRAM with gate leakage suppression circuit for mobile applications", *IEEE Journal of Solid-State Circuits*, 39(4), (Apr. 2004), 684-693.

Qin, Huifang, et al., "SRAM Leakage Suppression by Minimizing Standby Supply Voltage", *5th International Symposium on Quality Electronic Design (ISQED '04)*, (2004), 55-60.

Takeyama, Y., et al., "A low leakage SRAM macro with replica cell biasing scheme", *IEEE Journal of Solid-State Circuits*, 41(4), (Apr. 2006), 815-822.

Wang, Y, et al., "A 1.1 GHz 12 μA/Mb-Leakage SRAM Design in 65 nm Ultra-Low-Power CMOS Technology With Integrated Leakage Reduction for Mobile Applications", *IEEE Journal of Solid-State Circuits*, 43(1), (Jan. 2008), 172-179.

Yamaoka, M, et al., "A 300-MHz 25-μA/Mb-leakage on-chip SRAM module featuring process-variation immunity and low-leakage-active mode for mobile-phone application processor", *IEEE Journal of Solid-State Circuits*, 40(1), (Jan. 2005), 186-194.

Zhang, K, et al., "SRAM design on 65nm CMOS technology with integrated leakage reduction scheme", *2004 Symposium on VLSI Circuits, 2004. Digest of Technical Papers.*, (Jun. 2004), 294-295.

* cited by examiner

*Primary Examiner* — Tuan T Nguyen
*Assistant Examiner* — Toan Le
(74) *Attorney, Agent, or Firm* — Fish & Richardson P.C.

(57) ABSTRACT

A circuit includes a first negative feed back loop coupled to a virtual Vvdd power rail and a true Vdd power rail. A second negative feed back loop is coupled to the virtual Vvss power rail and a true Vss power rail. The virtual rail to virtual rail voltage difference is regulated at the highest threshold voltage between pull-up and pull-down transistors of a memory cell.

20 Claims, 3 Drawing Sheets

US 8,004,924 B2

VOLTAGE REGULATOR FOR MEMORY

BACKGROUND

With scaling of dimensions in static random access memories, leakage currents increase dramatically. As dimensions decrease, memory devices occupy more and more area of the circuits. SRAM blocks become the major contributor to total stand-by power consumption. Excess power consumption in mobile applications can adversely affect battery life. Circuit techniques that reduce the supply voltage or increase the ground voltage are most often used for SRAM leakage reduction. However the combined biasing scheme with simultaneous supply voltage reduction and ground voltage increase, presents several advantages compared to simple schemes such as better leakage reduction and reduced standard deviation of leakage power consumption.

The generation of biasing voltages on virtual supply (Vvdd) and virtual ground (Vvss) rails, has been controlled in prior circuits in order to reduce the leakage currents of SRAM cells, while maintaining the stored data. To control the voltage of the virtual ground rail and/or of the virtual supply rail of SRAM cells in stand-by mode passive and active techniques have been used. Among passive techniques, PMOS and/or NMOS diodes may be inserted between the true power rails and virtual rails. The diodes are sized to generate a voltage level depending on the leakage currents flowing through them. Other passive techniques use transistors as resistors instead of diodes, or combine transistors with diodes. Using such passive techniques, it is hard to ensure a sufficient level for data retention due to process, voltage and temperature fluctuations. Therefore, it requires pre-characterization steps to determine the voltage levels ensuring data retention and leads to conservative sizing resulting in inefficiency of leakage reduction. One circuit uses respectively a PMOS diode and a NMOS diode to control the biasing voltages on virtual supply and virtual ground rails. This becomes problematic in that the rail-to-rail voltage control is not accurate as threshold voltages of diodes are sensitive to process and temperature fluctuations.

Another way to control the voltages of virtual rails is to use clamping circuits or voltage regulators. Series type or switched capacitance based are active techniques. However, for combined biasing schemes, these solutions require two comparators and the generation of two reference voltages which is area and energy consuming. Besides, the feed-back is not applied to the rail-to-rail voltage and thus can lead to data loss. A further active technique uses replica SRAM cell transistors to control the ground voltage while maintaining a rail-to-rail voltage above twice the maximum value of threshold voltages from the Pull-Up and Pull-Down transistors of SRAM cells. However, in this technique, only the virtual ground voltage is increased while supply voltage remains nominal, which is under-optimal for leakage reduction.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

Figure 1:
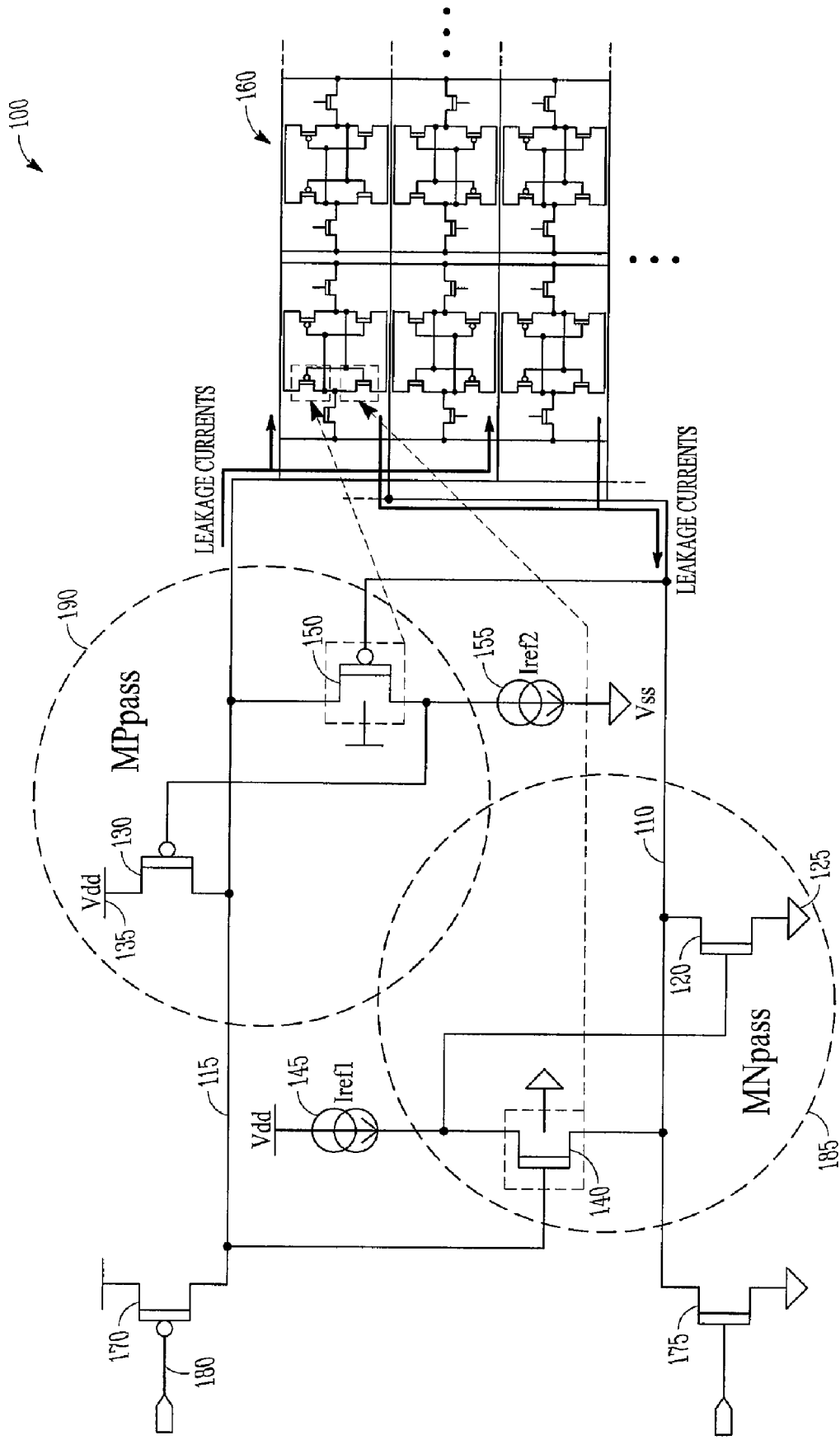
FIG. 1 is a circuit diagram of a voltage controller for static random access memory according to an example embodiment.

FIG. 1 is a regulator circuit 100 to control a rail-to-rail voltage applied to inactive static random access memory (SRAM) cells for leakage current reduction while ensuring data retention. Feed-back is used to improve the accuracy in controlling a rail-to-rail voltage applied to memory cells as it is less sensitive to process and temperature fluctuations. Compared to active schemes, the rail-to-rail voltage control combines biasing of virtual ground Vvss and virtual supply Vvdd rails 110 and 115 respectively to ensure data retention and enhance the leakage reduction compared to unique biasing voltage generation. In some embodiments, control is accomplished using less area and energy consumption than other active approaches.

In one embodiment, the virtual ground rail Vvss 110 is coupled through a Npass transistor 120 to a true ground rail 125, and the virtual supply rail Vvdd 115 is coupled through a Ppass transistor 130 to a true supply rail 135. An SRAM representative pull down transistor 140 has a gate coupled to the virtual supply rail Vvdd 115. It passes a current from a current source 145 to virtual ground rail 110 Vvss. Similarly, an SRAM representative pull up transistor 150 has a gate coupled to the virtual ground rail Vvss 110. It passes a current from a current source 155 to the virtual supply rail 115 Vvdd. The SRAM representative pull down transistor 140 and pull up transistor 150 are shown with respect to an SRAM sub-array 160. The virtual ground rail Vvss 110 and supply rail Vvdd 115 are also coupled to the sub-array 160 to provide a power supply voltage for each memory cell in the array. As can be seen, the memory cells include cross coupled pairs of pull up and pull down transistors to retain operating states representative of desired values. The SRAM representative transistors of the voltage regulator circuit 100 are formed to have the same characteristics as the SRAM transistors in one embodiment. A memory array in one embodiment may have four voltage regulator circuits 100, one coupled to each corner of the array 160 with suitable connections as shown to provide power on corresponding virtual supply and ground rails. Many other configurations of one or more voltage regulator circuits coupled to the array 160 may be used in further embodiments.

In one embodiment, the voltage between Vvdd 115 and Vvss 110 is controlled to the maximum value of gate-to-source voltages of the SRAM Pull-Up (MPU) 150 and SRAM Pull-Down (MPD) 140 representative transistors required to conduct the current imposed by the current references 155 and 145 respectively. Data retention in memory cells by the represented pull-up and pull-down transistors in the memory cells may be ensured by choosing the imposed currents. The imposed currents in one embodiment are set above the currents of SRAM Pull-Up 150 and Pull-Down 140 transistors biased on their threshold voltage in order to have a voltage difference between Vvdd 115 and Vvss 110 above the maximum value of threshold voltages of Pull-Down 140 and Pull-Up 150 transistors. Such a voltage difference ensures data retention in SRAM cells 160.

In one embodiment, the rail-to-rail voltage regulator circuit 100 is coupled to two switches: a header switch 170 and a footer switch 175. Their role is to disconnect true power rails, Vdd 135 and Vss 125, from virtual power rails, Vvdd 115 and Vvss 110, in stand-by mode and also to provide sufficient current during read/write operation of SRAM cells 160 in active mode.

In standby mode or when a sleep signal on line 180 is high, the header 170 and footer 175 are in an off-state. The leakage currents flowing through the SRAM cells 160 cause the voltage on Vvdd 115 to decrease and the voltage on Vvss 110 to increase. As the voltage difference between Vvdd 115 and Vvss 110 decreases and goes below the threshold voltage of either Pull-down 140 or Pull-Up 150 SRAM representative transistors, the output of the first high gain stage of the concerned voltage/current loop (illustrated by broken lines 185 and 190 respectively) drops quickly. This activates the corresponding pass transistor in order to either increase the voltage of Vvdd 115 or decrease the voltage of Vvss 110.

Figure 2:
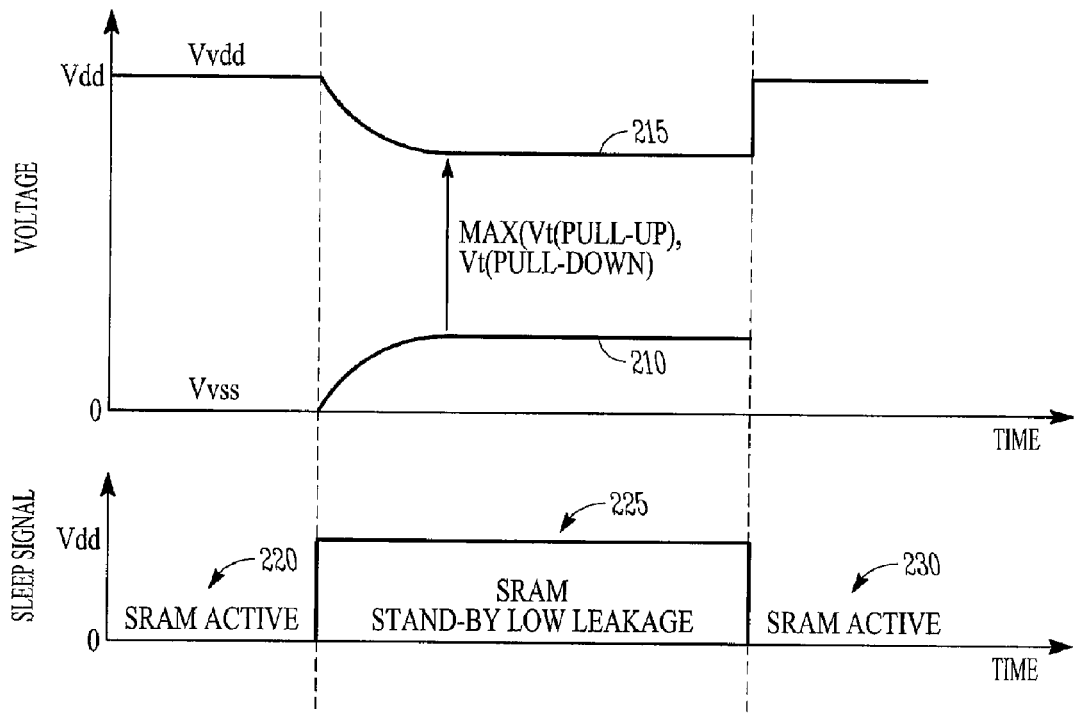
FIG. 2 is a timing diagram illustrating virtual rail voltages for active and standby time periods according to an example embodiment.

The resulting effect is the regulation of the rail-to-rail voltage at the highest threshold voltage between Pull-Up and Pull-Down transistors. FIG. 2 illustrates timing diagrams of virtual supply and virtual ground rails with respect to the sleep signal 170. The voltages of Vvss 110 and Vvdd 115 referenced to ground are represented at 210 and 215 respectively, and are determined by the sizing of the switches from each loop. During a first time period 220, the SRAM is active. Vvdd is high, and Vvss is low, providing a larger voltage range comparable to that provided by Vdd and Vss, less any drops due to header and footer transistors 170, 175. During a second time period 225, the SRAM is placed in a stand-by mode. Vvdd decreases and Vvss increases shortly after circuit 100 is placed in the mode, and regulation of the voltage difference begins. During a third time period 230, the SRAM becomes active, and the rails again increase quickly toward the true power rail voltages.

Figure 3:
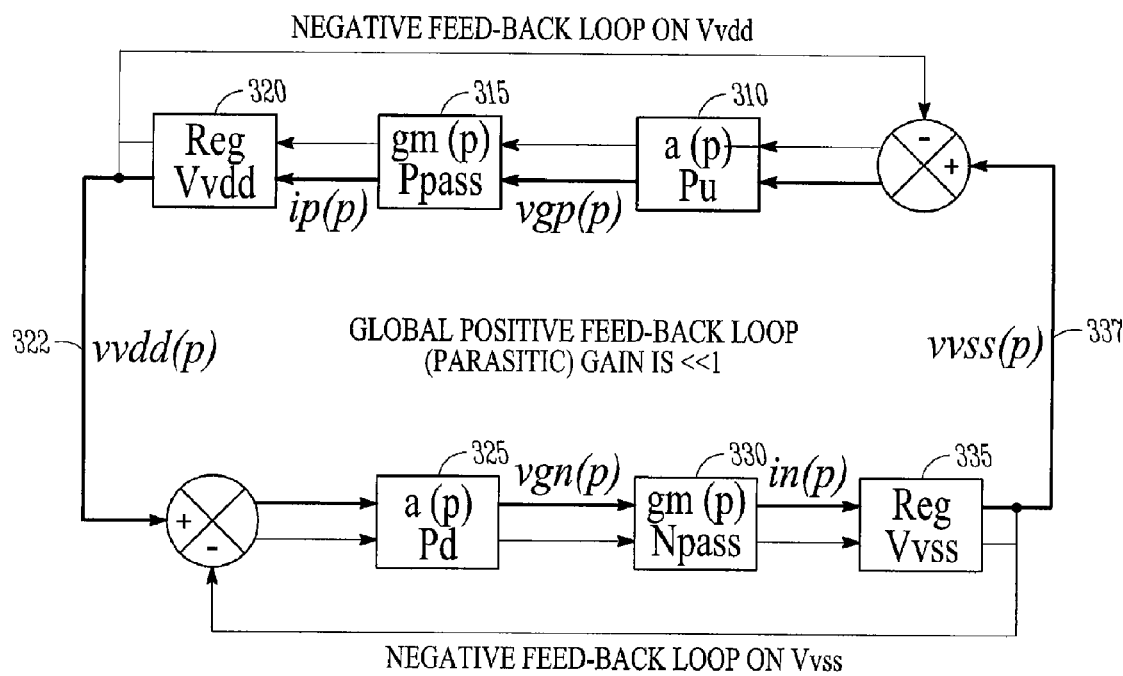
FIG. 3 is small signal equivalent block circuit diagram of the voltage controller of FIG. 1 according to an example embodiment.

The FIG. 3 represents a schematic block description of a small signal equivalent circuit of the circuit 100. Three loops are interacting. Two negative feedback loops 185, 190 ensure the voltage regulation of Vvss and Vvdd depending on the voltage difference between Vvdd and Vvss. Considering the feedback loop 190 on Vvdd, apu 310 represents the small signal voltage gain of the first stage constituted by the transistor MPU 150 and the current source 155. The output of the first stage is the gate voltage vgp(p) of the pass transistor Ppass 130. The pass transistor 130 is represented by a trans-conductance 315, converting its gate signal vgp(p) into a drain to source current ip(p). The last stage is represented by the small-signal equivalent resistance Reqvvdd 320 seen on the rail Vvdd 115, converting a variation of the current ip(p) into a variation of the voltage vvdd(p) at 322. The description of the feedback loop 185 on Vvss is exactly the same, and includes apd 325 representing the small signal voltage gain of the first stage constituted by the transistor MPD 140 and the current source 145. The output of the first stage is the gate voltage vgn(p) of the pass transistor Npass 120. The pass transistor 120 is represented by a trans-conductance 330, converting its gate signal vgn(p) into a drain to source current in(p). The last stage is represented by the small-signal equivalent resistance Reqvvss 335 seen on the rail Vvss 110, converting a variation of the current in(p) into a variation of the voltage vvss(p) at 337.

A third loop is due to the combination of the two first loops and is a source of instability as a positive feedback loop. However, its voltage gain is very low compared to the first two loops, and thus its impact on the rail-to-rail voltage regulation system is negligible.

Figure 4:
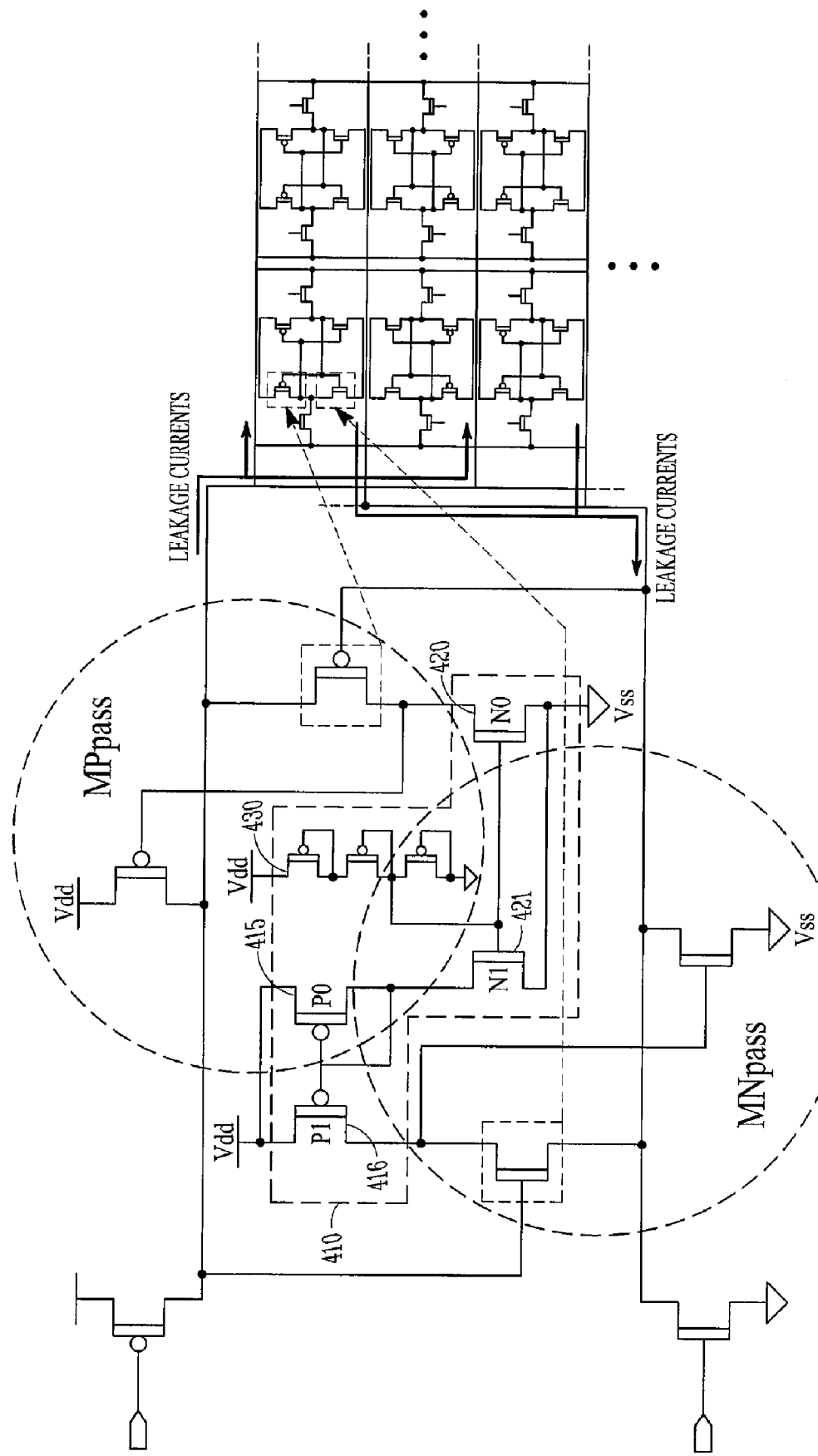
FIG. 4 is a circuit diagram of a voltage controlling illustrating an example current source according to an example embodiment.

In one embodiment, the current sources 145 and 155 may be realized as illustrated in the circuit of FIG. 4, which shows one example current reference indicated within broken line 410, that can be used to provide the current references 145 and 155. Many other current sources may be used in further embodiments. A current mirror (P0 415, P1 416) is inserted to impose the same current on both the MPU and MPD transistors 150, 140. This current is generated by applying a fixed voltage on a gate terminal of transistors N0 420 and N1 421. The fixed voltage can be set to the desired value by choosing the number of diodes in a stack of diodes 430 (three in the example).

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A method comprising:
placing a static random access memory into a standby mode by disconnecting virtual power rails Vvdd and Vvss from direct connection to true power rails Vdd and Vss;
providing negative feed back on the Vvdd power rail via a pull up transistor from a memory cell coupled to a first current source, and a Ppass transistor coupled between the Vvdd power rail and true Vdd power rail; and
providing negative feed back on the Vvss power rail via a pull down transistor from a memory cell coupled to a second current source, and an Npass transistor coupled between the Vvss power rail and the true Vss power rail.

2. The method of claim 1 wherein multiple pull up and pull down transistors are coupled to the current sources in a sub-array of memory cells.

3. The method of claim 2 wherein the rail to rail voltage is regulated at the highest threshold voltage between pull-up and pull-down transistors.

4. The method of claim 1 wherein the negative feedback loops regulate Vvdd and Vvss such that they provide a rail to rail voltage difference sufficient to retain data stored in the memory cell.

5. The method of claim 4 wherein the voltage difference is controlled to a maximum value of gate-to-source voltages of the pull-up and pull-down transistors sufficient to conduct current imposed by the current sources.

6. The method of claim 5 wherein the currents provided by the current sources are set above the maximum value of threshold voltages of the pull-down and pull-up transistors.

7. The method of claim 4 wherein the rail to rail voltage is regulated at the highest threshold voltage between pull-up and pull-down transistors.

8. The method of claim 1 wherein disconnecting virtual power rails Vvdd and Vvss from direct connection to true power rails Vdd and Vss comprises turning off header and footer switches.

9. A circuit comprising:
a pair of switches coupled between virtual power rails Vvdd and Vvss and corresponding true power rails Vdd and Vss;

a first negative feed back loop coupled to the Vvdd power rail via a pull up transistor from a memory cell and a Ppass transistor coupled between the Vvdd power rail and the true Vdd power rail;

a first current source coupled to the pull-up transistor;

a second negative feed back loop coupled to the Vvss power rail via a pull down transistor from a memory cell and an Npass transistor coupled between the Vvss power rail and the true Vss power rail; and a second current source coupled to the pull-down transistor.

10. The circuit of claim 9 and further comprising multiple pull up and pull down transistors are coupled to the current sources in a sub-array of memory cells.

11. The circuit of claim 10 wherein the rail to rail voltage is regulated at the highest threshold voltage between pull-up and pull-down transistors.

12. The circuit of claim 9 wherein the negative feedback loops regulate Vvdd and Vvss such that they provide a rail to rail voltage difference sufficient to retain data stored in the memory cell.

13. The circuit of claim 12 wherein the voltage difference is controlled to a maximum value of gate-to-source voltages of the pull-up and pull-down transistors sufficient to conduct current imposed by the current sources.

14. The circuit of claim 13 wherein the currents provided by the current sources are set above the maximum value of threshold voltages of the pull-down and pull-up transistors.

15. The circuit of claim 12 wherein the rail to rail voltage is regulated at the highest threshold voltage between pull-up and pull-down transistors.

16. The circuit of claim 9 wherein disconnecting virtual power rails Vvdd and Vvss from direct connection to true power rails Vdd and Vss comprises turning off header and footer switches.

17. The circuit of claim 9 and further comprising multiple memory cells in a sub-array coupled to the virtual power rails.

18. A circuit comprising:

a first negative feed back loop coupled to a virtual Vvdd power rail and a true Vdd power rail;

a second negative feed back loop coupled to the virtual Vvss power rail and a true Vss power rail; and wherein the virtual rail to virtual rail voltage difference is regulated at the highest threshold voltage between pull-up and pull-down transistors of a memory cell.

19. The circuit of claim 18 and further comprising a first current source coupled to the first feedback loop and a second current source coupled to the second feedback loop.

20. The circuit of claim 19 wherein the voltage difference is controlled to a maximum value of gate-to-source voltages of the pull-up and pull-down transistors sufficient to conduct current imposed by the first and second current sources.

* * * * *